(12) United States Patent
Thallner et al.

(10) Patent No.: US 9,666,470 B2
(45) Date of Patent: May 30, 2017

(54) RECEPTACLE DEVICE, DEVICE AND METHOD FOR HANDLING SUBSTRATE STACKS

(71) Applicant: EV GROUP E. THALLNER GMBH, St. Florian am Inn (AT)

(72) Inventors: Erich Thallner, St. Florian (AT); Friedrich Paul Lindner, Scharding (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 14/774,167

(22) PCT Filed: Mar. 27, 2013

(86) PCT No.: PCT/EP2013/056620
§ 371 (c)(1),
(2) Date: Sep. 10, 2015

(87) PCT Pub. No.: WO2014/154272
PCT Pub. Date: Oct. 2, 2014

(65) Prior Publication Data
US 2016/0020136 A1    Jan. 21, 2016

(51) Int. Cl.
| | | |
|---|---|---|
| H01L 21/68 | (2006.01) | |
| B25J 15/06 | (2006.01) | |
| H01L 21/687 | (2006.01) | |
| H01L 21/67 | (2006.01) | |

(52) U.S. Cl.
CPC .... *H01L 21/68785* (2013.01); *B25J 15/0608* (2013.01); *H01L 21/67092* (2013.01); *H01L 21/68721* (2013.01); *H01L 21/68728* (2013.01)

(58) Field of Classification Search
CPC ......... H01L 21/68785; H01L 21/67092; H01L 21/68721; H01L 21/68728; B25J 15/0608; B29C 65/785; B32B 2037/1081
USPC ....................... 294/65.5; 156/272.4
See application file for complete search history.

(56) References Cited

U.S. PATENT DOCUMENTS

| | | | | |
|---|---|---|---|---|
| 4,588,209 A | * | 5/1986 | Zebrowski | B42D 3/00 24/303 |
| 5,842,721 A | * | 12/1998 | Kawabe | G09F 1/10 281/45 |
| 6,866,237 B2 | * | 3/2005 | Dagan | A47G 1/17 248/206.5 |

(Continued)

FOREIGN PATENT DOCUMENTS

| | | | | |
|---|---|---|---|---|
| EP | 2 458 628 | | 5/2012 | ........... H01L 21/683 |
| JP | 2003-332403 A | * | 11/2003 | |

OTHER PUBLICATIONS

International Search Report from corresponding International Patent Application No. PCT/EP2013/056620, dated Aug. 12, 2013 (English-language translation provided).

*Primary Examiner* — Dean Kramer
(74) *Attorney, Agent, or Firm* — Kusner & Jaffe

(57) ABSTRACT

The invention relates to a retaining system for handling substrate stacks, including a retaining surface for retaining a first substrate, and one or more recesses provided relative to the retaining surface, for retaining first magnetic bodies for securing the first substrate relative to a second substrate that is aligned with the first substrate. Second magnetic bodies are applied on a holding side of the second substrate.

20 Claims, 5 Drawing Sheets

(56) References Cited

U.S. PATENT DOCUMENTS

Figure 1:
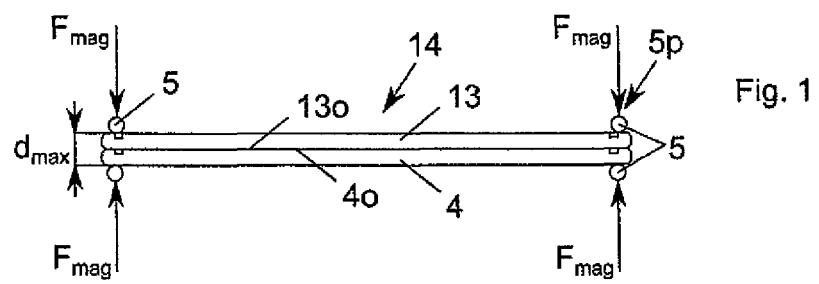

2006/0274474 A1* 12/2006 Lee .................. C23C 14/12
                                          361/143
2010/0080891 A1   4/2010 Yoshimura et al. ............ 427/64

* cited by examiner

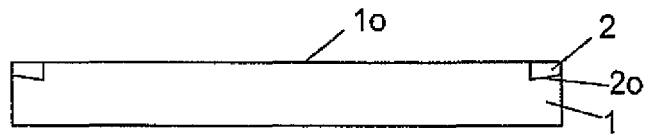
Fig. 4a
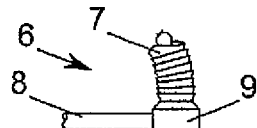
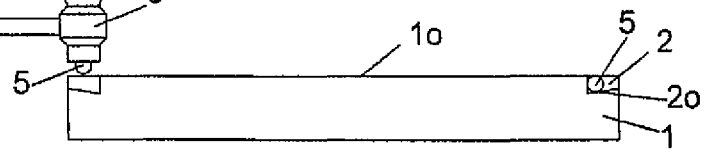
Fig. 4b
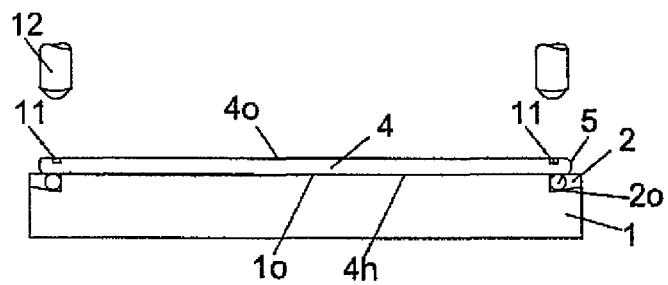
Fig. 4c
Fig. 4d
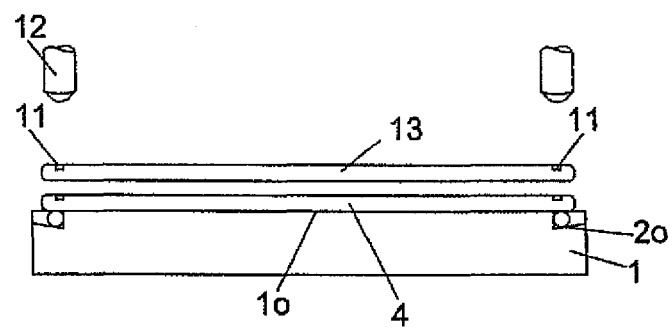
Fig. 4e
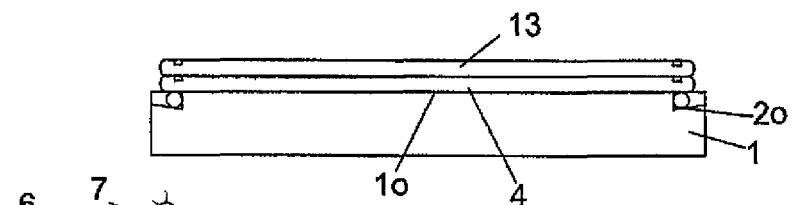
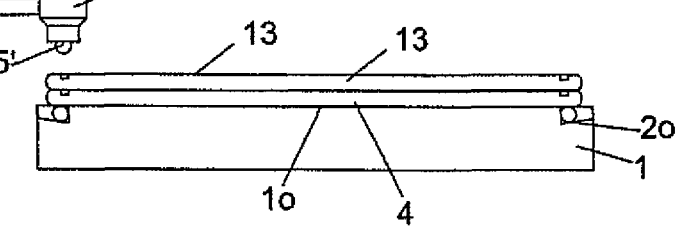
Fig. 4f

RECEPTACLE DEVICE, DEVICE AND METHOD FOR HANDLING SUBSTRATE STACKS

CROSS-REFERENCE TO RELATED APPLICATION

This application is a National Stage of International Application No. PCT/EP2013/056620, filed Mar. 27, 2013.

FIELD OF THE INVENTION

This invention relates to a retaining system for handling substrate stacks, a device for handling substrate stacks, as well as a corresponding method.

BACKGROUND OF THE INVENTION

In the semiconductor industry, substrates are quite often different; product substrates or carrier substrates are connected to one another. Bonding is cited as the connecting process. Two different types of bonds can be distinguished: the temporary bond and the permanent bond. In temporary bonding, a first substrate, in most cases a product substrate, is bonded to a second substrate, in particular a carrier substrate, in order to stabilize the product substrate by the carrier substrate.

After additional processes on the product substrate, the product substrate can be removed from the carrier substrate. In technical terminology, the removal process is called debonding.

In permanent bonding, an irreversible connection between two substrates, in most cases two product substrates, is sought. This type of bonding is used primarily in the building-up of substrate stacks with different functional planes. In the publication of Dragoi, V. and Pabo, E., Wafer Bonding Process Selection, The Electrochemical Society, ECS Transactions January 2010; 33: 509-517, for example, there is an overview on different bonding methods.

Primarily before the permanent bonding, product substrates have to be aligned to one another with a very high precision via alignment marks, which are located on their surfaces. In this case, to date, the alignment and the bonding of the substrates is done mainly in different modules: an alignment module and a bonding module. The latter is referred to in simplified terms as a bonder. A critical aspect of the separation of the alignment module and the bonding module exists in the transport of the substrates that are aligned to one another from the alignment module to the bonding module. In this way, even though it may be a very short distance, the two substrates can shift toward one another. Therefore, an attaching of substrates aligned toward one another is necessary.

In the state of the art, the attaching of two substrates is done, for example, with mechanical clamps. In most cases, the mechanical clamps are connected to a substrate holder, e.g., a chuck or fixture. One of the two substrates lies directly on the substrate holder. After the second substrate is aligned relative to the first substrate, the two substrates are brought into contact. Very often, spacers that are inserted from the edge between the two substrates are used in order to prevent the complete contact of the two substrates with one another up until the actual bonding process. Independent of the use of the spacers, mechanical clamps can attach both substrates on the substrate holder. If the substrate holder is used to retain and attach the two substrates, substrate holders and substrates have to be transferred from the alignment module to the bonding module either manually or fully automatically by a robotic arm.

SUMMARY OF THE INVENTION

The object of this invention is to provide a retaining system and a device as well as a corresponding method with which the handling of substrate stacks is improved and/or simplified.

In particular, the invention relates to a method and a device for aligning, clamping, and bonding two semiconductor substrates or a substrate stack formed from two or more substrates. The method according to the invention is advantageously used in an ultrahigh-vacuum environment.

The invention is based on the idea of securing two or more aligned substrates on one another by magnetic attachment means, in particular with omission of a retaining system, e.g., a chuck or fixture, on at least one of the two holding sides of the substrate stack facing away from the contact sides of the substrates. As a result, the substrates can be handled as substrate stacks that are aligned in an immobilized position with respect to one another.

In particular, the invention proceeds from a method of attaching two or more substrates, which form a substrate stack, via at least two magnets that are located on the opposite sides of the substrate stack in each case. The holding force generated by the magnets in this case is greater than 0.01N, preferably greater than 0.1N, more preferably greater than 1N, even more preferably greater than 10N, and most preferably greater than 100N. The force values indicated here are determined by fastening at least one of the two magnets on a spring balance and bringing the at least one of the two magnets into the vicinity of the second magnet so that the force action developing between the two magnets results in an expansion of the spring balance. A simple determination of the force caused by the magnetic force of attraction of the two magnets can be used. In the case where the two magnets are in the vertical position and have different masses, the calculated force values can be corrected against the force of gravity. The measurement of the magnetic force, however, can also be determined by any other method known to one of ordinary skill.

In general, in the case of bar magnets, a magnetic force law equivalent to Coulomb's Law can be found. The magnetic force in this case is directly proportional to the product of the pole strengths of the two magnets, but conversely proportional to the square of the distance. The magnetic force decreases as with increasing distance r with $1/r^2$. This law is also known under the name "magnetostatic force law."

Since a minimum holding force is necessary in order to ensure an attachment of the two substrates to one another according to the invention, and the thickness of any substrate in most cases can be very readily determined, a way arises, through the application of the "magnetostatic force law," of determining the minimum magnetic force that is necessary in order to attach the two substrates to one another. As a result, magnetic material can be specifically selected. Further, the material may be able to apply the corresponding minimum force for a given substrate stack thickness.

The substrates according to the invention are preferably substrates, in particular semiconductor substrates such as wafers. The semiconductor substrates have in particular a thickness of less than 1500 μm, and even more preferably less than 1000 μm.

For handling, in particular the transport from an alignment module to a bonding module or other processing modules, it is no longer necessary to carry along a retaining system, e.g., a substrate holder, on one of the two or both holding sides of the substrate stack. The substrate holders are in most cases very expensive, heavy tools optimized in particular for a module. The transport of the substrate holders between the modules is therefore connected to energy and costs, which can be saved with the invention. Primarily with application in alignment modules, in which preferably other substrate holders are used instead of bonding modules, this invention is of great technical advantage since the substrate stack can be moved solely with the attachment means or is transportable without the alignment of the substrates of the substrate stack being adversely affected.

The use of a substrate holder for transport of the aligned substrate stack between the modules can thus be completely eliminated. As a result, not only are the above-mentioned energy and cost savings produced, but rather also the required substrate holders are freed up for the actually intended purposes for which they were designed. The misappropriation of the substrate holders for transport is thus avoided by the embodiments according to the invention.

The retaining system according to the invention is further developed by one or more recesses being designed as at least one shelf arranged on a periphery of a retaining surface with a seating section for seating the attachment means and a seating section pointing toward the center of the retaining surface for installation of the attachment means. According to the invention, the attachment means, in particular in the form of magnetic bodies, are at least predominantly, preferably completely, held by their own weight in the recesses until the substrates are secured in an immobilized position by the attachment means. In this case, it is advantageous when the recesses are arranged uniformly distributed on the periphery of the retaining surface, in particular rotating throughout and/or facing each other in each case.

According to another embodiment of the retaining system, the seating section is tilted relative to the retaining surface by an angle (a) that is less than 60°, in particular (a) less than 45°, preferably (a) less than 30°, and even more preferably (a) less than 15°. In this connection, an automatic movement of the attachment means, in particular of the magnetic body, preferably spherical magnetic body, is made possible as long as the attachment means are not still in the immobilized position or the magnetic action of the attachment means is eliminated.

According to an embodiment of the device according to the invention, the attachment means have at least two pairs of magnetic elements. By the arrangement of the magnetic bodies of the pairs of magnetic elements on the holding sides of the substrate stack, the substrates in the aligned immobilized position are at least predominantly, preferably completely, attached by the magnetic force of the pairs of magnetic elements.

By each pair of magnetic elements being formed from a first magnetically active magnetic body and a second, in particular magnetically active, magnetic body magnetically attracted by the first magnetic body, the substrates can be secured in the aligned immobilized position at low cost. The first magnetic bodies are advantageously physically separated from the second magnetic bodies.

In further development of the device, it is provided to make the first and/or the second magnetic bodies spherical. By spherical configuration, the retaining surface on the holding side of the substrates is minimized, and the spherical magnetic bodies can be mechanically scraped in a simple way from the respective holding side during or after the bonding process. By the mutually induced polar alignment of two magnetic balls on respectively one of the surfaces of the substrate to be attached to one another, the magnetic bodies are secured in their opposing positions.

The magnetic bodies can be removed by one of the following methods:
  Active, mechanical scraping or rolling off with a mechanical device,
  Passive mechanical dropping due to loss of magnetic force of at least one of the magnetic bodies, caused by demagnetization by means of temperature and/or magnetic alternating fields,
  Mechanical grabbing of the magnetic bodies by means of a claw, and/or
  Magnetic attraction of the magnetic bodies with one or more magnets.

According to another embodiment of the invention, it is provided that the device has an alignment system for aligning the first substrate relative to the second substrate as well as a contacting system for bringing the substrates into contact. It is further advantageously provided that the device has a placing system for placing the attachment means, in particular the magnetic bodies, on sides of the substrate stack that are facing away from one another.

The features described for the retaining system are also to apply as disclosed as features of the method described below and vice versa.

As an independent invention, a method for handling a substrate stack that is to be bonded and that includes a first substrate and a second substrate aligned relative to the first substrate is also disclosed, whereby the first substrate for handling the substrate stack relative to the second substrate is secured by magnetically acting attachment means in an aligned immobilized position.

In this case, it is provided according to an embodiment of the method that the attachment means are also placed on holding sides of the substrate stack that are facing away from one another.

Further developments of the invention are indicated in the subclaims. Also, all combinations that consist of at least two of the features indicated in the specification, the claims and/or the figures fall within the scope of the invention. In the indicated ranges of values, values that lie within the above-mentioned limits are also to be disclosed as boundary values and can be claimed in any combination.

BRIEF DESCRIPTION OF DRAWINGS OF THE INVENTION

Figure 2:
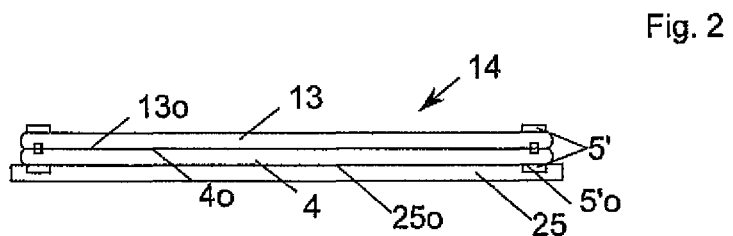
Figure 3:
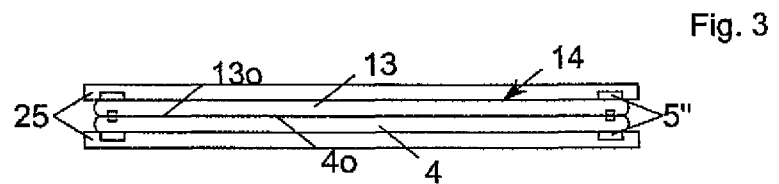
Figure 4G:
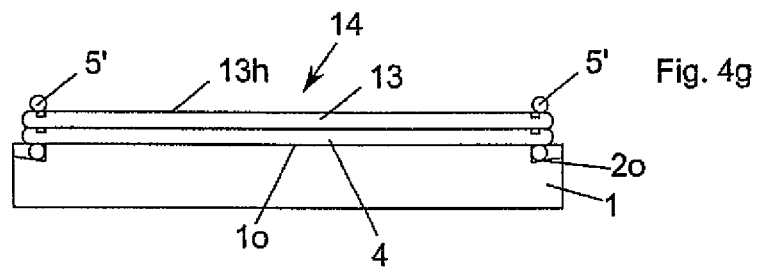
Figure 4H:
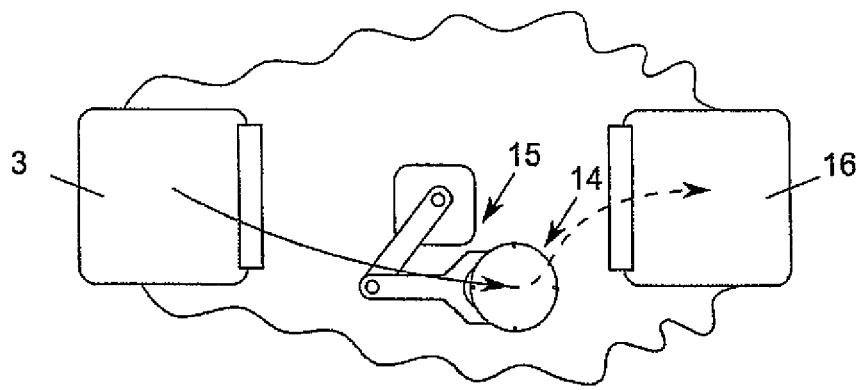
Figure 4I:
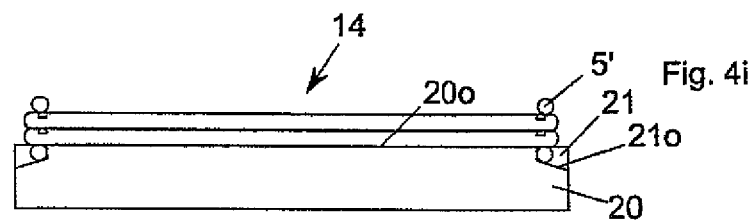
Figure 4J:
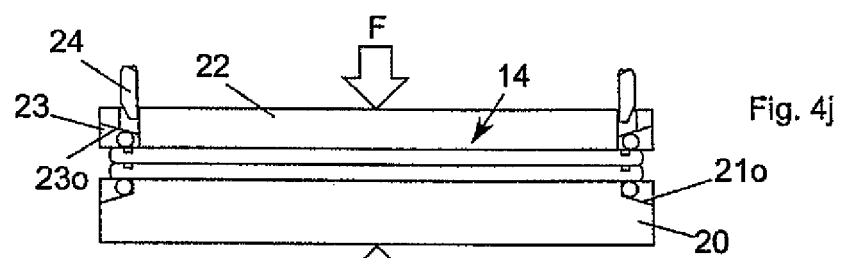
Figure 4K:
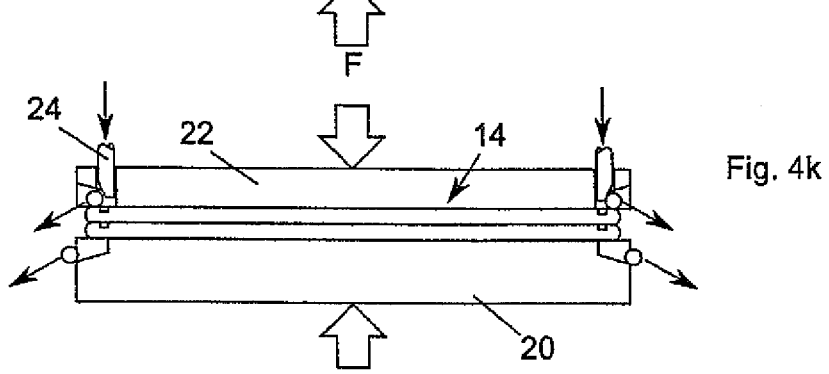
Figure 5A:
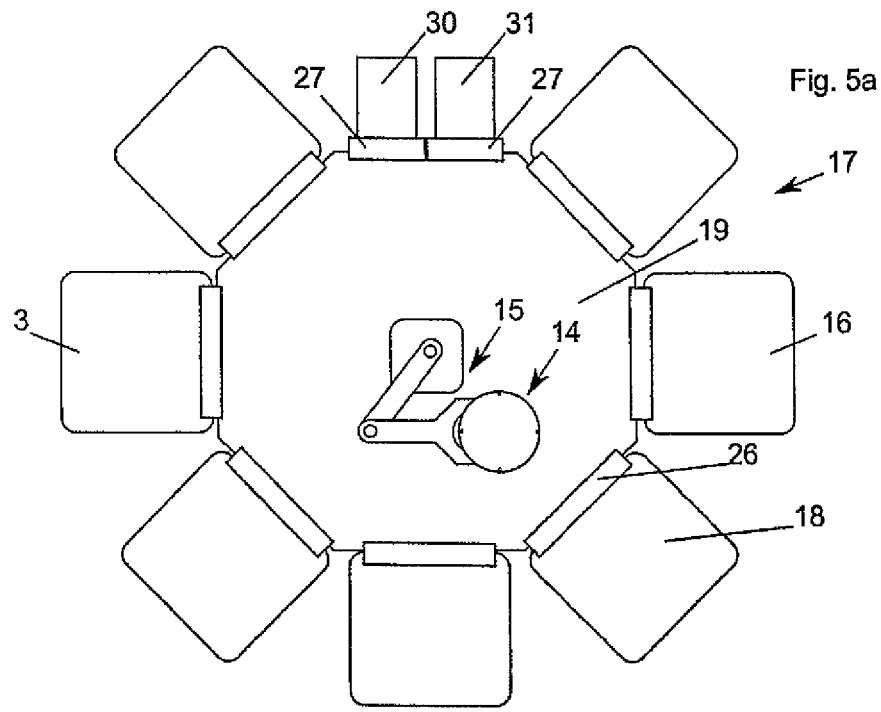
Figure 5B:
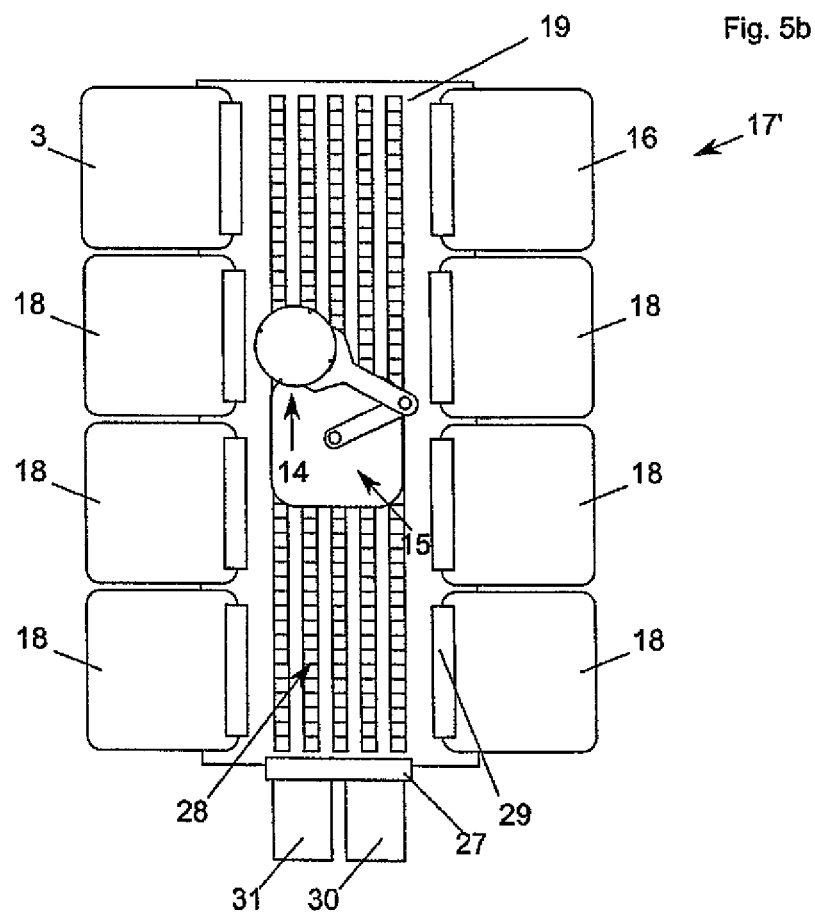
Figure 6:
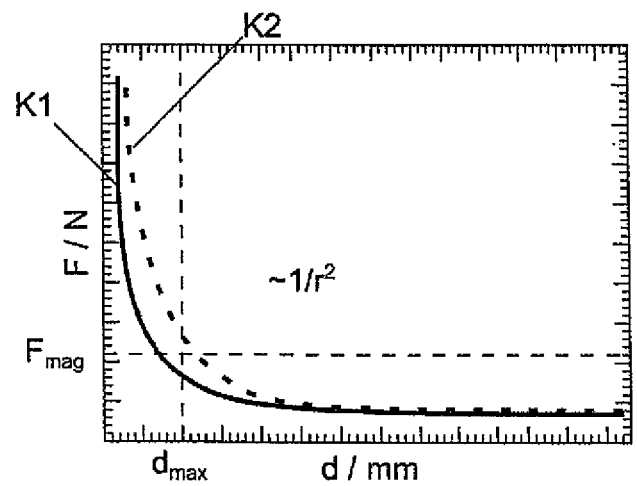
Figure 7A:
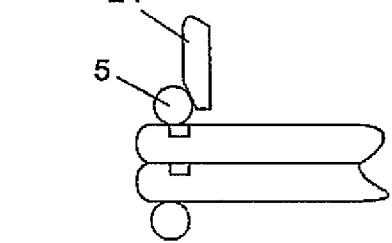
Figure 7B:
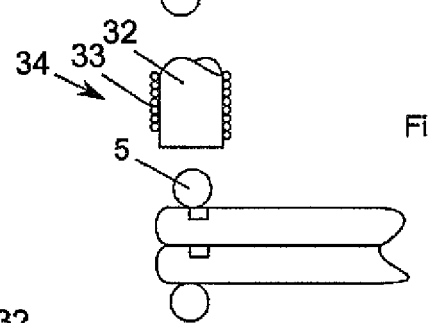
Figure 7C:
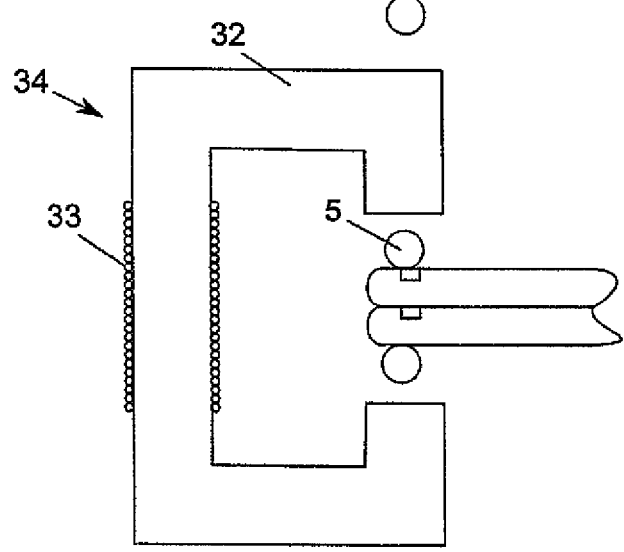

Other advantages, features and details of the invention follow from the subsequent description of embodiments as well as based on the drawings; the latter in each case show in diagrammatic view:

FIG. 1 A first embodiment of a substrate stack that is secured according to the invention with attachment means, FIG. 2 A second embodiment of a substrate stack that is secured according to the invention with attachment means, FIG. 3 A third embodiment of a substrate stack that is secured according to the invention with attachment means, FIG. 4a A first process step of an embodiment of the method according to the invention, FIG. 4b A second process step of the embodiment according to FIG. 4a, FIG. 4c A third process step of the embodiment according to FIG. 4a, FIG. 4d A fourth process step of the embodiment according to FIG. 4a, FIG. 4e A fifth process step of the embodiment according to FIG. 4a, FIG. 4f A sixth process step of the embodiment according to FIG. 4a, FIG. 4g A seventh process step of the embodiment according to FIG. 4a, FIG. 4h An eighth process step of the embodiment according to FIG. 4a, FIG. 4i A ninth process step of the embodiment according to FIG. 4a, FIG. 4j A tenth process step of the embodiment according to FIG. 4a, FIG. 4k An eleventh process step of the embodiment according to FIG. 4a, FIG. 5a A first embodiment of a device according to the invention, FIG. 5b A second embodiment of a device according to the invention, FIG. 6 A magnetic force spacing diagram with two curves for two different magnetic materials, FIG. 7a A first embodiment according to the invention for removal of magnetic bodies, FIG. 7b A second embodiment according to the invention for removal of magnetic bodies, and FIG. 7c A third embodiment according to the invention for removal of magnetic bodies.

DETAILED DESCRIPTION OF THE INVENTION

In the figures, advantages and features of the invention are characterized with identifying reference numbers in each case according to embodiments of the invention, whereby components or features with the same functions or functions that have the same effect are characterized with identical reference numbers.

In the figures, the features according to the invention are depicted not-to-scale in order to be able to mainly depict the function of the individual features. Also, the ratios of the individual components are partially disproportional.

For the described embodiments, attachment means according to the invention are used in the form of magnetic bodies 5, 5', 5" made of different materials and with different geometries. The magnets are in particular ferromagnetic. They preferably consist of one of the following elements or of one of these alloys.

In particular for room-temperature and high-temperature applications: iron, nickel, cobalt, In particular for low-temperature applications: gadolinium, terbium, dysprosium, holmium, and erbium, Alloys: AlNiCo, SmCo, $Nd_2Fe_{14}B$, EuO, $CrO_2$, $Ni_{80}Fe_{20}$, NiFeCo alloys, Heusler alloys.

The selection of materials for the magnetic bodies can be carried out as follows: For a given maximum substrate stack thickness $d_{max}$, as is shown in FIG. 1 and FIG. 6, a minimum holding force, i.e., a minimum magnetic force $F_{mag}$, is required. This minimum holding force $F_{mag}$ is applied by the magnetic bodies 5. To ensure that at least this minimum magnetic force $F_{mag}$ is present, the material K2 according to FIG. 6 must be selected, whose magnetic force spacing curve is depicted in dotted lines.

In FIGS. 1 to 3, substrate stacks 14 formed from a first substrate 4 and a second substrate 13 are depicted, which are aligned specifically to one another on a first contact surface 4o of the first substrate 4 and a second contact surface 13o of the second substrate 13. The deviation from the exact alignment of the two substrates 4 and 13 within the horizontal plane, which is parallel to the two surfaces 4o and 13o, is in this case less than 1 mm, preferably less than 10 μm, more preferably less than 1 μm, even more preferably less than 100 nm, most preferably less than 10 nm, and with the utmost preference less than 1 nm. For alignment, alignment markings 11, as is shown in FIG. 4d are provided. The substrate stack 14 is attached by attachment means in the form of magnetic bodies 5 in an immobilized position.

In a first embodiment according to FIGS. 1, 4b, 4c, and 7a-c, the magnetic bodies 5 are spherical. The magnetic bodies 5 are in each case arranged as pairs of magnetic elements 5p on two holding sides 4h, 13h in each case facing away with respect to the first and second contact surfaces 4o, 13o. The magnetic bodies 5 of each pair of magnetic elements 5p are self-attaching by the mutual magnetic attraction. In this connection, the magnetic bodies 5 exert a normal force in the direction of the respective holding sides 4h, 13h, on which they are arranged, by which the substrates 4, 13 are secured to one another.

Spherical magnetic bodies 5 have the advantage of only point-loading substrates 4, 13 on which they rest. Because the forces that occur are large enough to hold the substrates 4 and 13 together, but are in no case sufficient to destroy one of the two substrates, a locally limited, relatively high pressure is produced with only a few magnetic bodies 5. In addition, the contamination of the holding sides 4h, 13h or the entire surface of the substrates 4, 13 is minimized with point-loading, which is advantageous for extremely pure processes. Removal of spherical magnetic bodies 5' is preferably done by mechanical stripping or one of the other disclosed methods along the respective holding surfaces 4h, 13h.

In another embodiment according to FIG. 2, the magnetic bodies 5' are cylindrical. Cylindrical magnetic bodies 5' offer the advantage that the magnetic force that occurs is at least incompletely present as a point, but rather distributes over a support surface 5o' of the magnets 5'. The drawback is evidenced in the difficult removal of the cylindrical magnets after a process step, since the cylindrical magnetic bodies 5' cannot be rolled off as simply as the spherical magnetic bodies 5 unless they are attached so that their cylindrical axis is parallel to the substrate surfaces 4 and 13o.

In particular, the magnetic bodies 5' can be designed, integrated, or embedded in a carrier plate 25, which, in addition to the retaining of the magnetic bodies 5' for supporting the substrate stack 14, includes a support surface 25o.

In another embodiment according to FIG. 3, a ring-shaped magnetic body 5" is used, whose outer shape—or, in the special case of round substrates 4, 13, whose diameter—corresponds to the respective substrate 4, 13. The thickness of the disclosed magnetic body 5" crosswise to the holding side 4h, 13h is a few millimeters. Preferably, the thickness of the magnetic body 5" is greater than 0.1 mm, preferably greater than 0.5 mm, more preferably greater than 1.0 mm, even more preferably greater than 2 mm, most preferably greater than 3 mm, and with the utmost preference greater than 5 mm, but in particular less than 10 mm. Ring-shaped magnets 5" can also be incorporated according to the invention into the described carrier plates 25 with corresponding shapes.

In another embodiment, instead of the above-mentioned variants, at least one torus-shaped magnetic body is used, whose outer shape—or, in particular in the special case of round substrates 4, 13, whose diameter—resembles the substrate. A number of small torus-shaped magnetic bodies is conceivable according to the invention analogously to the above-described cylindrical embodiment, or a single torus-shaped magnetic body is conceivable according to the invention analogously to the above-described ring-shaped embodiment.

According to the invention, the first substrate 4 is connected together with the second substrate 13 via at least two pairs of magnetic elements 5*p* of magnetic bodies 5, 5', 5".

In respective alternative embodiments, in each pair of magnetic elements 5*p*, there is only one magnetic body 5, 5', 5" on one of the holding sides 4*h*, 13*h* of a substrate stack 14, while on the other side, there is one magnetic body 5, 5', 5" made of magnetizable material, in particular of the corresponding shape. In terms of the present disclosure, "magnetizable material" is characterized by the magnetization that is significantly lower in comparison to that of the magnetic bodies 5, 5', 5". Owing to the proximity to the magnets 5, 5', 5", an at least partial magnetization occurs, so that it can be said that there is a magnet in terms of the invention. The magnetizable materials are preferably one of the following elements or alloys:

(Ferritic) steel, iron
Mu-metal
Ferromagnetic amorphous metal
Ferromagnetic nanocrystalline metal According to the invention, the clamping force acting in the support point of a spherical magnetic body 5 is more than 0.01N, preferably more than 0.1N, more preferably more than 1N, most preferably more than 10N, and with the utmost preference more than 100N, but less than 1000N. The corresponding pressures are calculated based on known formulas as a function of the geometry of the magnets used in each case. The clamping force together with the static friction coefficient of the surfaces of the two substrates 4, 13 that are present in contact with one another on the contact surfaces 4*o*, 13*o* produce a corresponding static friction that is to be overcome.

Below, an embodiment of a method according to the invention is described, in which the attaching method according to the invention is used with the magnets 5, 5', 5" in order to attach or to secure two substrates 4 and 13 that form a substrate stack 14 according to an alignment process.

In a first process step according to FIG. 4*a*, a first substrate holder 1 (retaining system) is prepared in an alignment module 3 of a process unit, e.g., a cluster 17. The substrate holder 1 has a retaining surface 1*o* for retaining the first substrate 4. In addition, the substrate holder 1 has at least one, preferably at least two, more preferably at least three or more than three, even more preferably more than six, even more preferably more than 9, and with the utmost preference more than 12, recesses 2. The recesses 2 are preferably matched to the shape of the magnetic bodies 5 according to the invention.

If the magnetic bodies 5 are spherical, a seating section 2*o* preferably runs obliquely inward at a predetermined angle (a) in order to prevent the spherical magnetic body 5 from rolling away/falling out, until the immobilized position is produced and the magnetic bodies 5 secure each other.

If the magnetic bodies 5' are cylindrical magnetic bodies 5', the seating section 2*o* preferably runs parallel to the retaining surface 1*o*, so that the cylindrical magnetic bodies 5' can stabilize.

In a second process step according to FIG. 4*b*, the magnetic bodies 5 according to the invention are placed in the recesses 2. The placement can be done manually or preferably by a semi-automatic, more preferably fully-automatic, placing system 6. For example, it would be conceivable to fill the recesses 2 with spherical magnetic bodies 5 by means of the semi-automatic or fully-automatic placing system 6, consisting of a hose 7 for continuous feed of spherical magnetic bodies 5 to a holding device 8, as well as by means of a valve 9, which can be brought up to the recesses 2. At the end of the hose 7, there is a correspondingly fully-automatically adjusted valve 9, which can individually eject the magnetic bodies 5 and is supplied continuously via the hose 7 with additional bullet magnets 5. Control may be exerted by a software-supported control device, which is also responsible for controlling the other systems of the process plant.

In a third process step according to FIG. 4*c*, the first substrate 4 is discarded with its holding side 4*h* on the retaining surface 1*o* of the first substrate holder 1. The first substrate 4 can have any shape and can be structured in any way desired in particular on its contact surface 4*o*. The first substrate 4 preferably has alignment markings 11. The positions of the alignment markings 11 can be detected by corresponding optics 12 in the alignment module 3. With the detected data, control of the control system is possible.

In a fourth process step according to FIG. 4*d*, the second substrate 13 is aligned toward the first substrate 4. The alignment markings 11 are used in this case as reference points. In FIG. 4*d*, one skilled in the art recognizes a so-called "backside-alignment." In this special type of alignment, the alignment marks 11 are always located on the same side of the respective substrates. In principle, however, each type of alignment can be used. A second substrate holder, which holds the substrate 13, is not indicated for the sake of clarity, but corresponds to the first substrate holder 1. All substrate holders in particular can be transparent for infrared light and/or visible light.

In an alternative embodiment, corresponding holes, bores or passages can allow the optics 12 the view toward the alignment marks 11.

In a fifth process step according to FIG. 4*e*, the two substrates 4 and 13 are brought into contact with one another.

In a sixth process step according to FIG. 4*f*, small magnetic bodies 5—preferably the same magnetic bodies as disclosed in the second process step—are applied on the holding side 13*h* of the second substrate 13. Preferably in this case, the same placing system 6 is used as was used in the second process step.

In a seventh process step according to FIG. 4*g*, a substrate stack 14 attached by means of several magnetic bodies 5 is present and includes at least two substrates 4, 13. The embodiment according to the invention also allows for the attachment of more than two substrates by the process steps according to FIGS. 4*d* and 4*e* being repeated several times.

In an eighth process step according to FIG. 4*h*, the substrate stack 14 according to the invention is transported by a robotic transport system 15 from the alignment module 3 to a bonding module 16. The alignment module 3 and the bonding module 16 are preferably part of a cluster 17, in particular a high-vacuum cluster, as is illustrated in FIG. 5*a* or 5*b*. In the cluster 17, additional modules 18 can be found for the processing of the substrate stack 14. The modules 18 can be analysis modules, heating modules, cooling modules, enameling modules, centrifuging and spray-enameling modules, development modules, etching modules, cleaning modules, or other modules known by one having ordinary skill in the art to be applicable. The cluster 17 is preferably a high-vacuum cluster. The modules 3, 16, 18 are enclosed in a central chamber 19 that can be evacuated. In addition, all modules 3, 16, 18 can preferably be hermetically sealed to the central chamber 19 and evacuated independently from the central chamber 19. The central chamber 19 is connected to the environment via a positing system.

In a ninth process step according to FIG. 4i, the substrate stack 14 according to the invention is deposited on a retaining surface 20o of a bonding chuck 20, e.g., a retaining system, with bonding chuck recesses 21. Seating sections 21o of the bonding chuck recesses 21 are preferably made so that in the case of a loss in magnetic action of the magnetic bodies 5 of the magnet pair 5p, an automatic removal of the magnets 5 is carried out by the force of gravity. In particular, the seating sections 21o have an inclination relative to the retaining surface 20o of the bonding chuck 20, in particular by an angle (a').

In a tenth process step according to FIG. 4j, the bonding process is performed by a pressure plate 22 with pressure plate recesses 23 pressing on the holding side 13h of the second substrate 13 in the substrate stack 14 and the bonding process being performed. In most cases, the bonding process is performed at elevated temperatures. In this case, the substrate stack 14 is heated via the bonding chuck 20 and/or the pressure plate 22. Corresponding (not indicated) heating elements are preferably located in the bonding chuck and/or the pressure plate. The pressure plate recesses 23 have surfaces 23o running inclined in particular on the retaining surface 20o.

In an extension of the embodiment according to the invention, the magnetic bodies 5 are heated above the Curie temperature so that they lose their magnetization and preferably drop automatically from the substrate stack 14, as is illustrated in FIG. 4k. The magnetic bodies 5 in the bonding chuck recesses 21 preferably drop by the force of gravity alone owing to the corresponding structural design of the bonding chuck recesses 21.

According to an alternative embodiment, the magnetic bodies 5 of the pressure plate recesses can be ejected by ejector elements 24, as is illustrated in FIG. 7a. The displacement of the magnets 5 from the bonding chuck recesses 21 and/or the pressure plate recesses 23 can also be done by mechanical means alone by corresponding ejection elements 24 below the Curie temperature. These ejection elements 24 must then be correspondingly incorporated in the bonding chuck 20 (not indicated in FIGS. 4i-4k) and/or in the pressure plate 22. The dropped magnets 5 are correspondingly collected and stored in the bonding chamber.

In another embodiment, the magnetic bodies 5 are removed from the first and/or second substrate by an electromagnet 34 including a coil 33 and a magnetic core 32, as is illustrated in FIG. 7b. In a first embodiment, only an electromagnet 34 of one side is used. By removing a magnetic body 5 by the electromagnet 34 and subsequent removal of the electromagnet 34, the second magnetic body automatically loses its adhesion and drops off. In a special embodiment, an electromagnet 34 can be used on the top side of the substrate stack, and another electromagnet 34 can be used on the bottom side of the substrate stack. The removal of the magnetic bodies 5 from the electromagnets 34 is done by the switching-off of the electromagnetic field by stopping the power supply by the coil 33. When using two electromagnets 34, the upper or lower polarity can be selected accordingly, so that either +/+, −/−, +/− or −/+ possible combinations are produced. The magnetic bodies 5 accordingly rotate until their poles are aligned corresponding to the applied poles of the electromagnets 34.

In another embodiment, a U-shaped magnetic core is used, whose poles in each case show on the top side or the bottom side of the substrate stack, as is illustrated in FIG. 7c. According to the invention, here only one coil 33 is used. By the U shape of the electromagnet 34 according to FIG. 7c, two different poles are produced using a single coil. To that effect, the possibilities of the polarity are either +/− or −/+. The magnetic bodies 5 accordingly rotate until their poles are aligned corresponding to the applied poles of the electromagnets 34.

For one skilled in the field, it is clear that the above-mentioned embodiments of the magnetic body removal 5 according to the invention are configured in such a way that they can be moved in the x-direction and/or the y-direction and/or the z-direction so that they can extend to the magnetic bodies 5 to be removed again from the substrate stack after their successful removal.

In a special embodiment, the magnetic bodies 5 are then magnetized again and reused so that a closed circuit results.

The bonding forces, which occur during the bonding process, are greater than 100N, preferably greater than 1000N, more preferably greater than 10,000N, and even more preferably greater than 100,000N. The bonding temperatures are greater than 50° C., preferably greater than 100° C., more preferably greater than 200° C., even more preferably greater than 400° C., most preferably greater than 600° C., and with the utmost preference greater than 800° C.

The method presented according to the invention is not only limited to the substrate transport between an alignment module and a bonding module. The method in principle can always be used when the task is to perform an attachment of multiple substrates in a substrate stack 14 in order to transport the substrate stack 14 over a distance. When the magnetic bodies 5, 5', 5" are strong enough, even a transport of the substrate stack 14 over wide distances would be conceivable.

The method according to the invention is suitable primarily for alignment and bonding in the cluster 17, in particular a high-vacuum cluster.

In both embodiments shown in FIGS. 5a and 5b, the cluster 17, 17' includes a cluster lock-gate 27, a central chamber 19, and the corresponding modules 3, 16, 18. An input-FOUP (front opening unified pod—rack [holding device for multiple substrates]) 30 and an output-FOUP 31 are connected to the cluster lock-gate 27 for loading and unloading substrates 4, 13.

The retaining of a substrate 4, 13 is done by means of a robotic system 15, which brings a substrate 4, 13 into the central chamber 19 via the cluster lock-gate 27. The central chamber can be evacuated; an ultrahigh vacuum can preferably be set.

The pressure in the central chamber 19 can be evacuated to less than $10^{-3}$ mbar, preferably to less than $10^{-4}$ mbar, more preferably to less than $10^{-5}$ mbar, even more preferably to less than $10^{-6}$ mbar, most preferably to less than $10^{-7}$ mbar, and with the utmost preference to less than $10^{-9}$ mbar.

Each individual one of the modules 3, 16, 18 can be evacuated and is hermetically separable from the central chamber by the module lock-gate 26. The pressure in each module can be evacuated to less than $10^{-3}$ mbar, preferably to less than 10-4 mbar, more preferably to less than $10^{-5}$ mbar, even more preferably to less than $10^{-6}$ mbar, most preferably to less than $10^{-7}$ mbar, and with the utmost preference to less than $10^{-9}$ mbar.

In the first embodiment illustrated in FIG. 5a, each of the modules 3, 16, 18 is connected via a module lock-gate 26 to the central chamber 19. The modules 3, 16, 18 are arranged in the shape of a star around the central chamber 19.

In a second embodiment illustrated in FIG. 5b of the cluster 17', the different modules 3, 16, 18 are arranged parallel to one another along a transport system 28, in which one or more robotic systems 15 can move. Also, only one robotic system 15, on which multiple gripper arms are located, would be used. Here, each of the modules 3, 16, 18 is connected via a module lock-gate 29 to the central chamber 19.

Below, a special embodiment of the bonding process is described, which uses, on the one hand, the magnetic clamping according to the invention and, on the other hand, the cluster 17.

A first substrate 4 is brought into the cluster 17 from the input-FOUP 30 via the cluster lock-gate 27 or is already located within the cluster 17. The cluster 17 is preferably evacuated immediately after the cluster lock-gate 27 is closed. Then, the robotic transport system 15 moves the substrate 4 into a pretreatment module 18. The pretreatment module 18 is evacuated before the module lock-gate 26 is opened. The first substrate 4 is then introduced into the pretreatment module 18 and correspondingly pretreated. The pretreatment module can be, for example, a heating module, a plasma module, an ion unit for bombarding the substrate surface with ions, a sputtering unit, a module for UV irradiation, a module for metal deposition (PVD, CVD, PECVD, ALD), a unit for specific oxidation of the substrate surface, or any unit known by one of ordinary skill to be applicable.

A correspondingly similar pretreatment obtains the second substrate 13 in the same and/or a corresponding separate module 18.

The first substrate 4 is brought by a pretreatment module into a prealignment module, in which a rough alignment of the first substrate 4 is carried out.

The second substrate 13 is brought by the robotic arm of the robotic transport system from the pretreatment module, rotated, and also roughly pre-positioned in the prealignment module. The alignment accuracies of the rough pre-alignment, e.g. an alignment, of the first substrate 4 and/or the second substrate 13 are better than 1 mm, preferably better than 500 µm, more preferably better than 250 µm, even more preferably better than 100 µm, most preferably better than 50 µm, and with the utmost preference better than 20 µm.

The first substrate 4 is brought into the alignment module 3 and pre-attached there, for example by an electrostatic substrate holder, mechanical clamping, a vacuum substrate holder, or adhesion. The second substrate 13 is also brought into the alignment module 3 and aligned relative to the first substrate 13 in the X-Y direction, i.e., parallel to the respective contact surface 4o, 13o. In addition, a wedge error compensation is performed as well as a relative approximation of the two substrates 4, 13 from a distance of several millimeters to centimeters at a distance of approximately 20 µm-2000 µm.

After successfully being brought into contact, the clamping according to the invention of the substrate stack 14, which includes the two substrates 4, 13 that are brought into contact, is carried out by means of magnetic clamps.

Then, the transfer into a bonding chamber 16 is carried out within the cluster 17. The substrate stack 14 is deposited by the robotic transport system 15 on pins in the bonder. The pins drop and deposit the substrate stack on the bonding chuck 20. The bonding chuck 20 and/or the pressure plate 22 is/are produced according to the embodiments of the invention so that it/they can receive the magnetic bodies 5, 5', 5".

Then, surface of the pressure plate 22 is brought into contact with the substrate stack 14. From the time of the mechanical contact between bonding chuck 20, substrate stack 14, and pressure plate 22, the magnets 5, 5', 5" can be removed. Either they fall by themselves—because of the loss of ferromagnetism at a temperature above the Curie temperature—or they are mechanically removed before and/or after the temperature increase.

The following are now conceivable according to the invention: a heat treatment, the introduction of UV energy via a pressure plate 22 that is transparent for UV light into the bonding chamber, or the application of an electrical voltage between the top side and the bottom side of the substrate stack as is required for the anodic bonding.

Before the unloading of the substrate stack 14, the bonding chamber—and thus the substrate stack—is brought to an unloading temperature that is between the bonding temperature and room temperature. Then, the bonding chamber is opened, and the pins raise the substrate stack in such a way that it can be removed by the robotic transport system. At this time, the magnets 5, 5', 5" are already located in a collecting tank within or near the bonding chamber.

Then, the substrate stack is preferably transported in a cooling module. A cooling to room temperature is carried out within the cooling module.

The finished substrate stack is deposited in the output-FOUP 31 from the high-vacuum cluster via the cluster lock-gate 27.

In the embodiment that is shown in the simplest manner, the central chamber 19 acts as a positing system, which separates the modules from the central chamber 19 and/or from the environment via the cluster lock-gate 27 and/or the module lock-gate 26. According to the invention, however, it would also be conceivable to provide separate positing systems before each module 3, 16, 18 and/or the input-FOUP or output-FOUP in order to increase the throughput of the wafer that is used and to ensure a continuous operation or a continuous operation with storage capacity of additional FOUPs.

The number of positing systems between the central chamber 19 and/or the modules 3, 16, 18 or between the central chamber 19 and the input-FOUP or output-FOUP can be as high as desired. At least one positing system, preferably at least two, more preferably at least three, and even more preferably at least four, most preferably at least five, and with the utmost preference at least six positing systems, can be used.

REFERENCE SYMBOL LIST

1 First substrate holder
1o Retaining surface
2 Recesses
2o Seating section
3 Alignment module
4 First substrate
4h Holding side
4o First contact surface
5, 5', 5" Magnetic body
5p Pair of magnetic elements
5'o Base surface of the cylindrical magnet
6 Semi-automatic or fully automatic filling system
7 Hose
8 Holding device
9 Valve
11 Alignment markings
12 Optics
13 Second substrate
13h Holding side
13o Second contact surface
14 Substrate stack according to the invention
15 Robotic transport system 16 Bonding module
17 High-vacuum cluster
18 Module
19 Central chamber
20 Bonding chuck
20o Retaining surface
21 Bonding chuck recesses
21o Surface
22 Pressure plate
23 Pressure plate recesses
23o Surface
24 Ejector element
25 Carrier plate
25o Support surface
26 Module lock-gate
27 Cluster lock-gate
28 Transport system
29 Module lock-gate
30 Input-FOUP
31 Output-FOUP
32 Magnetic core
33 Coil
34 Magnet
dmax Substrate stack thickness
Fmag Holding force, magnetic force
K1 First magnetic material with a low magnetization.
K2 Second magnetic material with a strong magnetization.

Having described the invention, the following is claimed:

1. A retaining system for handling substrate stacks, comprising:
    a retaining surface for retaining a first substrate; and
    one or more recesses relative to the retaining surface for retaining first magnetic bodies for securing the first substrate to a second substrate that is aligned with the first substrate,
    wherein second magnetic bodies are applied on a holding side of the second substrate, and
    wherein the recesses define at least one shelf, arranged on a periphery of the retaining surface, with a seating section having a first area for seating of the first magnetic bodies in the retaining surface and a second area directed toward a center of the retaining surface for installation of the first magnetic bodies therein.

2. The retaining system according to claim 1, wherein the seating section is inclined relative to the retaining surface by an angle (a) less than 60°.

3. The retaining system according to claim 1, wherein the recesses are uniformly distributed on the periphery of the retaining surface.

4. A device for handling a substrate stack comprising a first substrate and a second substrate aligned relative to the first substrate, the device comprising:
    magnetically acting attachment means for securing the first substrate to the second substrate in an aligned immobilized position; and
    a placing system for placing the attachment means on respective sides of the substrate stack that are facing away for one another,
    wherein the attachment means has at least two pairs of magnetic elements,
    wherein each of the pairs of magnetic elements is formed from a first magnetically active magnetic body and a second magnetically active magnetic body that is magnetically attracted by the first magnetic body, and
    wherein the first magnetic body and/or the second magnetic body is designed in the shape of a sphere.

5. The device according to claim 4, wherein the first magnetic body and/or the second magnetic body is attached to the substrate stack in the immobilized position by a magnetic force produced by the pair of magnetic elements.

6. A device for handling a substrate stack comprising a first substrate and a second substrate aligned relative to the first substrate, the device comprising:
    magnetically acting attachment means for securing the first substrate to the second substrate in an aligned immobilized position;
    a placing system for placing the attachment means on respective sides of the substrate stack that are facing away for one another; and
    a retaining system for handling the substrate stack, the system comprising a retaining surface for retaining the first substrate and one or more recesses relative to the retaining surface for retaining the magnetically acting attachment means for securing the first substrate relative to a second substrate that is aligned with the first substrate,
    wherein the magnetically acting attachment means comprise first magnetic bodies and second magnetic bodies,
    wherein second magnetic bodies are applied on a holding side of the second substrate, and
    wherein the recesses define at least one shelf, arranged on a periphery of the retaining surface, with a seating section having a first area for seating of the first magnetic bodies in the retaining surface and a second area directed toward a center of the retaining surface for installation of the first magnetic bodies therein.

7. The device according to claim 6, wherein the seating section is inclined relative to the retaining surface by an angle (a) less than 60°.

8. The device according to claim 6, wherein the seating section is inclined relative to the retaining surface by an angle (a) less than 15°.

9. The device according to claim 6, wherein the recesses are uniformly distributed on a periphery of the retaining surface.

10. The device according to claim 6, further comprising:
    an alignment system for aligning the first substrate relative to the second substrate; and
    a contacting system for bringing the substrates into contact.

11. A method for handling a substrate stack to be bonded, the substrate stack comprising a first substrate and a second substrate that is aligned relative to the first substrate, the method comprising:
    securing the first substrate in an aligned immobilized position through magnetically acting attachment means for handling the substrate stack relative to the second substrate; and
    placing the attachment means on holding sides of the substrate stack that face away from one another,
    wherein the substrate stack is fixed by the magnetically acting attachment means, and
    wherein the attachment means is spherical.

12. The method according to claim 11, wherein the substrate stack is secured with omission of a chuck or fixture.

13. A retaining system for retaining a preformed substrate stack thereon, the preformed substrate stack comprising a first substrate, a second substrate, and respective first and second magnetically acting attachment means holding the first substrate and the second substrate together, the second magnetically acting attachment means being disposed on a holding side of the second substrate, the second substrate being aligned with the first substrate, the retaining system comprising:

a retaining surface configured to retain the first substrate of the preformed substrate stack, the retaining surface having at least one recess formed therein, the recess being configured to retain the first magnetically acting attachment means, wherein the preformed substrate stack is formed prior to being retained by the retaining system.

14. The system according to claim 13, wherein the recess defines at least one shelf, arranged on a periphery of the retaining surface, with a seating section having a first area for seating the first magnetically acting attachment means in the retaining surface and a second area directed toward a center of the retaining surface for installation of the first magnetically acting attachment means therein.

15. The system according to claim 14, wherein the seating section is inclined relative to the retaining surface by an angle (a) less than 60°.

16. The system according to claim 14, wherein the recess is uniformly distributed on the periphery of the retaining surface.

17. A device for handling first and second substrates, the second substrate being aligned with the first substrate, the device comprising:

a placing system for placing first and second magnetically acting attachment means on respective sides of the first and second substrates that face away from each other, the magnetically acting attachment means being configured to secure the first substrate to the second substrate in an aligned immobilized position to form a substrate stack, wherein the substrate stack is formed with omission of a retaining system, wherein the magnetically acting attachment means have at least two pairs of magnetic elements, wherein each of the pairs of magnetic elements is formed from a first magnetically active magnetic body and a second magnetically active magnetic body that is magnetically attracted by the first magnetic body, and wherein the first magnetic body and/or the second magnetic body is designed in the shape of a sphere.

18. The device according to claim 17, wherein the first magnetic body and/or the second magnetic body is attached to the substrate stack in the immobilized position by a magnetic force produced by the pair of magnetic elements.

19. A device for handling first and second substrates, the second substrate being aligned with the first substrate, the device comprising:

a placing system for placing first and second magnetically acting attachment means on respective sides of the first and second substrates that face away from each other, the magnetically acting attachment means being configured to secure the first substrate to the second substrate in an aligned immobilized position to form a substrate stack, a retaining system for retaining the substrate stack thereon, the retaining system comprising a retaining surface configured to retain the first substrate of the substrate stack, the retaining surface having at least one recess formed therein, the recess being configured to retain the first magnetically acting attachment means, wherein the substrate stack is formed with omission of the retaining system.

20. The device according to claim 19, further comprising:

an alignment system for aligning the first substrate relative to the second substrate; and a contacting system for bringing the substrates into contact.

* * * * *